METHOD FOR FABRICATING A DOUBLE DRIFT DIODE

Filed March 26, 1973

United States Patent Office 3,822,153
Patented July 2, 1974

3,822,153

METHOD FOR FABRICATING A DOUBLE DRIFT DIODE

Bernard Collins De Loach, Jr., Murray Hill, William Charles Niehaus, Florham Park, and Thomas Edward Seidel, Berkeley Heights, N.J., assignors to Bell Telephone Laboratories, Incorporated, Murray Hill, N.J.

Filed Mar. 26, 1973, Ser. No. 345,081
Int. Cl. H01l 7/54
U.S. Cl. 148—1.5 10 Claims

ABSTRACT OF THE DISCLOSURE

A method for fabricating semiconductor diodes particularly double drift region diodes of the $P^+IPININ^+$ type adapted for use in oscillators operating at frequencies from about four to 30 gigahertz. A P layer and then an N layer are formed by ion implantation into a high resistivity P-type epitaxial layer, I, disposed over a $P^+$-type substrate. Over the P-type epitaxial layer a high resistivity N-type epitaxial layer, also I, is formed and subsequently an $N^+$-type layer is formed contiguous with the surface of the N-type epitaxial layer.

BACKGROUND OF THE INVENTION

1. Field of the Invention

This invention relates to fabrication of semiconductor devices; and more particularly to a method for fabricating double drift region diodes.

2. Description of the Prior Art

There is considerable interest currently in solid state microwave energy sources. Such sources promise to be more compact and less expensive, and to have considerably longer life than microwave tubes.

Characteristic of such a microwave energy source is the inclusion of a multizone semiconductive element which includes an avalanche region and a drift region between cathode and anode terminal portions, and that a dynamic negative resistance is achieved by introducing an appropriate transit time to avalanching carirers in their travel across the drift region.

Among the most promising forms of solid state microwave sources are double drift region diodes which offer significant performance improvements over single drift region diodes. In such diodes, one drift region is for holes and one is for electrons, with both types of charge carriers sharing one common avalanche zone. The impurity profile is similar to two complementary single drift diodes in series, that is, for example, $P^+PNN^+$. As a result, efficiency, power output, and impedance per unit area are all increased.

In an effort to provide double drift region diodes of greater output power, various suggestions have been made for increasing the efficiency of such oscillators. Specifically, in U.S. Pat. 3,356,866, issued Dec. 5, 1967 to T. Misawa, it is suggested that epitaxial techniques be employed to fabricate a diode which has a PIPININ resistivity profile. The letters P and N denote P-type and N-type material, respectively, and the letter I denotes a nearly intrinsic material with a relatively higher resistivity than the P or N. In such a diode the transit times of the two types of carriers through the two separate drift regions advantageously are made substantially equal so each type of carrier contributes to the negative resistance effect whereby the overall efficiency is enhanced. It can be appreciated that to satisfy this last relationship, accurate control of the various layers is important.

It is known that improved control of impurity profiles usually can be achieved through the use of ion implantation; and, accordingly, ion implantation has been used in the fabrication of double drift diodes. Fabrication using one ion implantation is described in U.S. Pat. No. 3,628,-185 issued to Evans et al., on Dec. 14, 1971. The patent teaches the fabrication of a $P^+PNN^+$ structure by growing an N-type epitaxial layer on an $N^+$ substrate; then forming into the epitaxial layer a P layer by ion implantation and a $P^+$ layer by diffusion. Fabrication using three ion implantations to further improve impurity control is described in an article entitled "Double-Drift-Region Ion-Implanted Millimeter-Wave IMPATT Diodes" by T. E. Seidel, R. E. Davis, and D. E. Iglesias published in the *Proceedings of the IEEE*, No. 8, Vol. 49, Aug. 1971. The article teaches forming a high resistivity epitaxial layer over a $P^+$ substrate and then ion implanting three separate impurity layers into the epitaxial layer to form a $P^+PNN^+$ structure. For example, as taught therein, to produce a diode adapted for use in oscillators operating at about 100 gHz. the deepest implanted layer, the P layer, is formed using 250 kev. boron; and to produce a device adapted for use in oscillators operating at about 80 gHz. the same layer is formed using 300 kev. boron. The depth of the layer below the surface in the 80 gHz. device is about 0.7 microns.

However, straightforward application of these two ion implantation techniques without modification to produce a diode of suitably larger dimensions, e.g., having an implanted layer about 5.5 microns below the surface, so as to be adapted for use in oscillators operating at lower frequencies, e.g., between four and 30 gigahertz, would require the use of higher implantation energies to form impurity layers at a deeper depth. The equipment to produce the higher energies is much more expensive than the more commonly used 300 kilo volt accelerators. For example, the 5.5 micron deep layer would require approximately 12 million electron volt boron. This can be produced by using doubly charged boron in conjunction with an approximately six million volt accelerator which, however, costs several times more than the 300 kilo volt accelerator.

SUMMARY OF THE INVENTION

Accordingly, it is an object of this invention to provide a method for reducing the amount of implantation energy required to fabricate a semiconductor diode. It is another object of this invention to provide a method for fabricating double drift region diodes adapted for use in oscillators operating at frequencies from about 4 to 30 gigahertz.

To these and other ends, semiconductor diodes are fabricated in accordance with this invention by forming a high resistivity P-type epitaxial layer over a $P^+$-type substrate. Subsequently, P-type and then N-type impurities are ion implanted thereby forming a P-type layer beneath an N-type layer in the high resistivity P-type epitaxial layer. Over this P-type epitaxial layer a high resistivity N-type epitaxial layer is formed and then, contiguous with the surface of the high resistivity N-type epitaxial layer, another N-type layer of lower resistivity is formed.

It will be appreciated that the described method can have several variations when used to form a semiconductor diode. In particular, varying such processing parameters as ion implantation energy and epitaxial layer thickness, determines whether the P-type and N-type conductivity layers are contiguous or separated by regions of high resistivity, thereby forming such impurity profiles as, for example, the presently preferred embodiment, $P^+IPININ^+$.

DETAILED DESCRIPTION

Figure 1:
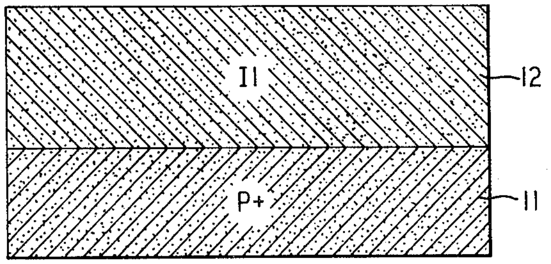
FIGS. 1 through 4 show a cross section of a portion of a double drift diode as it appears after fabrication in accordance with certain successive steps of the method of this invention.

Referring to FIG. 1, fabrication of a diode in accordance with a preferred embodiment of this invention begins by forming a monocrystalline silicon bulk portion 11 which may be a portion of a slice of P-type conductivity produced by boron doping to have a substantially uniform resistivity of about 0.0015 ohm centimeters.

Also shown in FIG. 1 is a high resistivity P-type epitaxial layer 12 which is formed contiguous with bulk portion 11. Layer 12 is lightly doped and can be nearly intrinsic and is therefore designated as I1. Typically, epitaxial layer 12 contains boron impurities with a concentration in the range of about $1\times10^{15}$ to about $5\times10^{15}$ per cubic centimeter. For structures which will be used in oscillators operating at about 10 gigahertz, fabrication is adapted so that the thickness of the epitaxial layer advantageously is about 4.5 microns.

Figure 2:
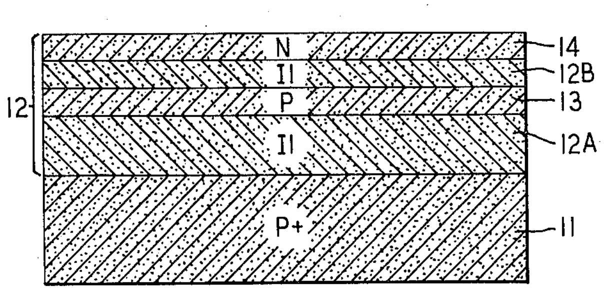

After forming epitaxial layer 12, ion implantation is used in accordance with this invention to introduce impurities to form a P-type layer 13 and an N-type layer 14 which are both shown in FIG. 2. As a result of implanting into a crystalline structure, the concentration of the implanted impurities first increases then decreases with increasing distance into epitaxial layer 12. The local peak concentration for P-type impurities occurs in layer 13 and is formed further into epitaxial layer 12 than the local peak concentration for N-type impurities which occurs in layer 14. For simplicity and clarity of illustration the impurity distributions are depicted in the drawing as layers having abrupt line boundaries. However, they are not abrupt, but are peaked distributions which intersect each other and form a lightly doped, high resistivity region between them. Advantageously, when it is desired to have a greater range for a given ion implantation voltage doubly ionized boron is used instead of singly charged boron to produce layer 13, which is the deeper of the two layers. Subsequently, N-type impurities such as phosphorous are used to implant layer 14. In this particular embodiment, 300 kilo volts is used to implant 600 kev. doubly ionized boron thereby forming P-type layer 13 and 200 kilo volts is used to implant 200 kev. phosphorous thereby forming N-type layer 14. Accordingly, in the presently preferred embodiment, implantation of layers 13 and 14 divides layer 12 into four portions which are shown in FIG. 2 as layers 12A, 12B, 13 and 14. Layer 12A serves as part of a drift region of the diode and layer 12B serves as part of the avalanche zone of the diode.

The selection of implantation energies is a factor in determining the separation distance of the local N-type impurity concentration peak in layer 14 from the local P-type impurity concentration peak in layer 13. The separation between the two peaks is known as the avalanche zone and in this particular embodiment, adapted for use in oscillators operating at about 10 gHz., is about 0.9 microns in width. Advantageously, to ensure an avalanche zone appropriately wide for efficient operation, the two local impurity concentration peaks should be formed an appropriate distance apart. As a result, there is formed a region between the two impurity concentration peaks where the net effective impurity concentration is about equal to the impurity concentration of epitaxial layer 12. The net effective impurity concentration takes into account the compensating effect of one type impurity by another type impurity. The width of this region between the peaks will be formed larger for lower frequencies than for higher frequencies. As an example, in devices adapted for operation at 4 gHz. the width is about 1.5 microns.

In order to improve efficiency and to obtain symmetric operation of the diode, it is advantageous that the net effective impurity concentration of P-type layer 13 and that of N-type layer 14 be equal. Accordingly, while the impurity doses of the implanted N and P impurities are approximately equal, the impurity dose of N-type implanted impurities advantageously is increased over the impurity dose of the P-type implanted impurities sufficiently to compensate for the P-type impurities in the lightly doped, high resistivity epitaxial layer 12. A typical range for the impurity doses of either the implanted N or P impurities is about $0.8\times10^{12}$ to $3\times10^{12}$ per square centimeter with the N impurity dose typically about 10 to 15 percent greater than the P impurity dose.

Figure 3:
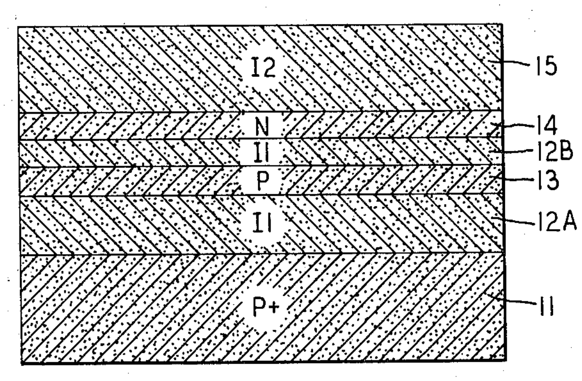

After ion implanting layers 13 and 14, a high resistivity N-type epitaxial layer 15 is formed contiguous with layer 14. Layer 15, shown in FIG. 3, is lightly doped and can be nearly intrinsic and is therefore designated as I2. Typically, epitaxial layer 15 contains N-type impurities such as phosphorous or arsenic having impurity concentration in the range of about $1\times10^{15}$ to about $5\times10^{15}$ per cubic centimeter. Advantageously, when fabricating diodes to be used in oscillators operating at about 10 gHz., the thickness of epitaxial layer 15 is selected to be about 4.5 microns.

The method of successively forming layers 13, 14 and 15 is considered to be a significant part of this invention. Ion implanting layers 13 and 14 into layer 12 before forming epitaxial layer 15 permits use of lower implantation energies than would be required if layers 13 and 14 were formed in accordance with the method described in the above mentioned article by Seidel et al. The article teaches forming the layers to their desired final depth by a single implantation. In contrast, applicants' method uses a shallower implantation in conjunction with forming an epitaxial layer above the implatation to achieve the final desired depth. It is the particular juxtaposition of the steps of ion implanting and forming the epitaxial layers that reduces the implantation energy required. In particular, it is possible to fabricate, in accordance with the method of this invention, diodes adapted for use in oscillators operating at about 10 gHz. by using only 300 kilo volt accelerators. Alternatively, as already noted, fabrication of such diodes in accordance with the Seidel article would require accelerators capable of producing about six million volts, even if doubly charged boron were used.

Because two ion implantations precede forming an epitaxial layer it is advantageous in using the method of this invention to maintain the dose of the implanted impurities low enough so that damage is minimized to the surface of epitaxial layer 12 which, after implantation, is also the surface of layer 14. For example, in a typical diode, if the ion dose is kept within the previously suggested range of $0.8\times10^{12}$ to $3\times10^{12}$ per square centimeter then it will not be necessary to remove any damaged portion of the surface of layer 14 before forming epitaxial layer 15 over layer 14.

Nevertheless, typically, the surface of layer 14 is chemically cleaned before forming epitaxial layer 15. An example of the sequence of cleaning steps used is: exposing the surface to an ozone ambient at about 270° C. for about 30 minutes, exposing the surface to a solution of water, hydrogen peroxide, ammonium hydroxide in a 1–1–4 proportion for about 10 minutes at about 100° C., and exposing the surface to a deionized water rinse. Surface preparation can also advantageously include heating at about 900° C. for about 15 minutes to anneal any implantation damage that does exist and simultaneously to form an oxide which protects the surface during any subsequent storage. Of course, before forming epitaxial layer 15 the oxide would be removed by, for example, exposing the oxide to a solution of water and hydrofluoric acid in a 20 to 1 proportion for about 10 minutes.

Figure 4:
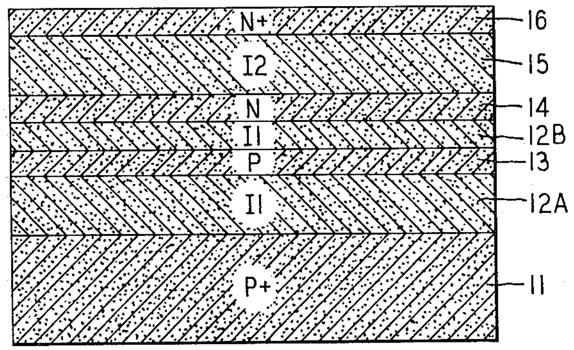

Subsequent to the formation of epitaxial layer 15 a low resistivity N-type layer 16, shown in FIG. 4, is formed contiguous with epitaxial layer 15. Typically, layer 16, which facilitates making ohmic contact to layer 15, is made with a phosphorous diffusion into layer 15. The diffusion results in a thin layer of about 0.5 microns having a higher impurity concentration than layer 15 thereby reducing the thickness of high resistivity epitaxial layer 15. Of course, ion implantation or any other suitable process known to alter conductivity can be substituted for diffusion. Alternatively, layer 16 can be made by forming an epitaxial layer over layer 15.

In operation, layer 15 forms a drift region complementing and, advantageously for efficient operation, approximately equaling in thickness and total number of impurities the drift region formed by layer 12A.

Various modifications and variations will no doubt occur to those skilled in the various arts to which this invention pertains. For example, N-type material can be substituted for P-type material with a corresponding substitution of P-type material for N-type material.

Alternatively, only the conductivity type of the implanted P and N material can be changed by substitution of the opposite type conductivity thereby producing a $P^{+}INIPIN^{+}$ impurity profile such as is disclosed in U.S. Pat. 3,566,206 issued to D. J. Bartelink et al. on Feb. 23, 1971.

Additionally, processing parameters can be varied to alter the thickness of the high resistivity layers.

Still further, the thickness of the high resistivity layer between the implanted P and N layers can be further increased by additional heating subsequent to the implantation of the P and N layers. The heating redistributes the implanted layers and increases the compensation of one type impurity by another type impurity thereby increasing the thickness of the high resistivity layer between the two layers and the grading of the impurity layer boundaries. These and all other variations which basically rely on the teachings through which this disclosure has advanced the art are properly considered within the scope of this invention.

What is claimed is:

1. In a method for fabricating a semiconductor diode including steps of forming over the surface of a body of semiconductor material a first epitaxial layer of higher resistivity than that of the body, the improvement being the steps of:

ion implanting impurities of a first conductivity type into the first epitaxial layer to form a layer having a distribution of first conductivity type impurities whose concentration first increases then decreases with increasing distance into the epitaxial layer thereby forming a first local peak concentration;

ion implanting impurities of a second conductivity type into the first epitaxial layer to form a layer having a distribution of second conductivity type impurities whose concentration first increases then decreases with increasing distance into the epitaxial layer thereby forming a second local peak concentration which is closer to the surface of the epitaxial layer than the first local peak concentration;

forming over the first epitaxial layer a second epitaxial layer whose impurity concentration about equals the impurity concentration of the first epitaxial layer; and forming contiguous with the second epitaxial layer a third layer having a lower resistivity than the second epitaxial layer.

2. A method as recited in claim 1 wherein the body of semiconductor material and the first epitaxial layer are of the first conductivity type, and the second epitaxial layer and the third layer are of the second conductivity type.

3. A method as recited in claim 1 wherein the body of the semiconductor material is of the second conductivity type and the third layer is of the first conductivity type.

4. A method as recited in claim 1 wherein the implantation of the impurities of the first and second conductivity type is sufficient that the net effective impurity concentration of one of the two impurity distributions is about equal to the net effective impurity concentration of the other impurity distribution and that there is a region between the two impurity concentration peaks where the net effective impurity concentration is about equal to the impurity concentration of the first epitaxial layer.

5. A method as recited in claim 1 wherein the ion implanted impurities of the first conductivity type are doubly ionized boron.

6. A method as recited in claim 1 wherein the ion implantations each are sufficient to produce an impurity dose of about $0.8\times10^{12}$ to about $3\times10^{12}$ per square centimeter.

7. A method as recited in claim 1 wherein the third layer is formed by forming a third epitaxial layer over the second epitaxial layer.

8. A method as recited in claim 1 wherein the third layer is formed by introducing impurities into the second epitaxial layer.

9. A method as recited in claim 8 wherein the impurities are introduced by diffusion.

10. A method as recited in claim 8 wherein the impurities are introduced by ion implantation.

References Cited

UNITED STATES PATENTS

| | | | |
|---|---|---|---|
| 3,383,567 | 4/1968 | King et al. | 317—234 |
| 3,483,443 | 12/1969 | Mayer et al. | 317—234 |
| 3,520,741 | 7/1970 | Mankarious | 148—175 |
| 3,622,382 | 11/1971 | Brack et al. | 148—1.5 X |
| 3,702,790 | 11/1972 | Nakanuma et al. | 148—1.5 |
| 3,718,502 | 2/1973 | Gibbons | 148—1.5 UX |
| 3,726,719 | 4/1973 | Brack et al. | 148—1.5 |
| 3,756,861 | 9/1973 | Payne et al. | 148—1.5 |

L. DEWAYNE RUTLEDGE, Primary Examiner

J. M. DAVIS, Assistant Examiner

U.S. Cl. X.R.

148—175; 317—235